United States Patent [19]
Bottini
[11] 3,727,064
[45] Apr. 10, 1973

[54] OPTO-ISOLATOR DEVICES AND METHOD FOR THE FABRICATION THEREOF

[75] Inventor: Michael Lucien Bottini, San Jose, Calif.
[73] Assignee: Monsanto Company, Saint Louis, Mo.

[22] Filed: Mar. 17, 1971
[21] Appl. No.: 125,044

[52] U.S. Cl. ..........250/217 S, 307/311
[51] Int. Cl. ..........H01j 39/12
[58] Field of Search ..........250/211 R, 211 J, 250/227, 239, 199, 217 S; 307/311; 315/236; 317/235

[56] References Cited

UNITED STATES PATENTS

| | | | |
|---|---|---|---|
| 3,304,430 | 2/1967 | Biard | 250/211 J |
| 3,486,029 | 12/1969 | Barrett | 250/211 J |
| 3,153,149 | 10/1964 | Finigian | 250/239 |
| 3,289,002 | 11/1966 | Goodman | 250/239 |
| 3,462,605 | 8/1969 | Engeler | 250/211 J |
| 3,354,316 | 11/1967 | Deverall | 250/211 J |
| 3,413,480 | 11/1968 | Biard | 250/211 J |

*Primary Examiner*—James W. Lawrence
*Assistant Examiner*—D. C. Nelms
*Attorney*—William I. Andress, John D. Upham and Neal E. Willis

[57] ABSTRACT

The disclosure herein relates to opto-isolators (emitter-detector coupled pairs) and to a method for the fabrication and packaging thereof into devices having a plural lead dual-in-line configuration. Disclosed herein are plastic-packaged devices for optical electronic coupling between light-emitters and light sensors (detectors) useful to effect a variety of electronic functions, and provide extremely high electrical isolation between input and output together with ultra-fast speed of response.

11 Claims, 16 Drawing Figures

PATENTED APR 10 1973

3,727,064

INVENTOR
MICHAEL L. BOTTINI
BY William I. Andress
ATTORNEY

INVENTOR
MICHAEL L. BOTTINI
BY William J. Andres
ATTORNEY

OPTO-ISOLATOR DEVICES AND METHOD FOR THE FABRICATION THEREOF

BACKGROUND OF THE INVENTION

This invention relates to the field of solid-state semiconductor opto-isolator devices and to fabrication methods therefor.

Prior art methods for fabricating opto-isolator devices include the use of fiber optic light pipes, high index of refraction glass and epoxy resins as the coupling media between the emitter and detector which are commonly packaged separately in headers, such as TO–18 and TO–5, as individual units or discrete devices or in module type configurations. The terms "TO–18" an "TO–5" are abbreviations referring to well-known and conventional types of transistor outline (TO) headers used as support members on which transistors or other semiconductor devices are mounted.

To applicant's knowledge, prior to the present invention, it was not known to provide unitary opto-isolators in plastic packages suitable for automatic insertion into printed circuit boards in standard dual-in-line configuration. In addition, opto-isolators available prior to applicant's invention had limited use because of the high cost of manufacture, due in part to custom-design requirements and/or materials and methods of fabrication.

It is therefore an object of the invention to provide plastic-packaged opto-isolator devices suitable for use in standard dual-in-line printed circuit boards.

It is a further object of this invention to provide an inexpensive, simple, efficient method for the fabrication of the opto-isolators provided herein.

These and other objects of the invention will become apparent from the detailed description given below.

SUMMARY OF THE INVENTION

The present invention relates to opto-isolators fabricated by means providing a standard outline electronic package which can be automatically inserted into a printed circuit board having a standard dual-in-line configuration.

In brief, the opto-isolators of this invention are fabricated by providing lead frames of the desired configuration; indenting, jogging or bending specified portions thereof designated for bonding pads for the light-emitting diode (LED), photo-sensitive device and lead wires; attaching a plurality of LED's onto a plurality of bonding pads therefor on a first (emitter) lead frame; attaching a plurality of photosensitive devices (diodes, transistors, FET's, SCR's, IC's etc.) onto a plurality of bonding pads therefor on a second (detector) lead frame identical to said first lead frame; wire bonding electrical leads from said LEDs and photosensitive devices to the appropriate bonding pads therefor on said lead frames; positioning said emitter lead frame and said detector lead frame relative to each other in such manner that the LEDs and photosensitive devices are in face-to-relationship and the lead-outs of the emitters and detectors are on opposite sides facing in opposite directions; applying semiconductor junction coating material between the emitters and detectors to optically and mechanically couple these devices when the emitter and detector lead frames are brought together or within operable proximity; encapsulating the emitter-detector coupled pair with an opaque plastic; separating the plurality of encapsulated emitter-detector pairs on said lead frames into individual units and forming the leads of the opto-isolator package into a standard dual-in-line configuration.

BRIEF DESCRIPTION OF THE DRAWINGS

FIG. 2B shows a photo-diode, FIG. 2C shows a photo-transistor and FIG. 2D shows a photo SCR.

DESCRIPTION OF PREFERRED EMBODIMENTS

The present invention in its preferred embodiments relates to the fabrication of six-lead plastic-packaged dual-in-line opto-isolators having gallium arsenide (GaAs) light-emitting diodes (LEDs) optically and mechanically coupled to photo-sensitive silicon devices, e.g., photo-diodes, photo-transistors, photo-FET's, photo-SCR's, photo-sensitive integrated circuits, etc.

EXAMPLE

In one preferred embodiment of this invention a method is described for fabricating a six-lead plastic dual-in-line opto-isolator having a GaAs LED and a silicon PIN photo-diode coupled pair.

Figure 1A:
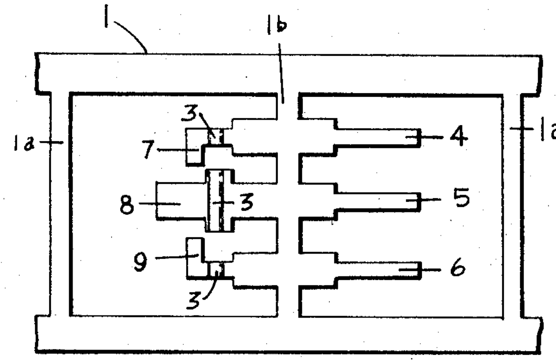
FIG. 1A is a top plan view of a section of the lead frame (emitter lead frame) for the light-emitting diodes (LED's) for the opto-isolators herein.
Figure 1B:
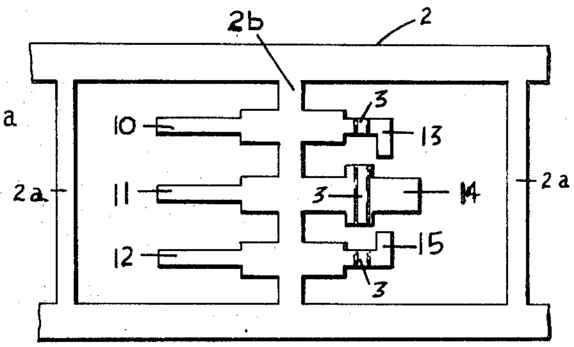
FIG. 1B is a top plan view of a section of the lead frame (detector lead frame) for the photo-responsive devices of the opto-isolators herein.
Figure 1C:
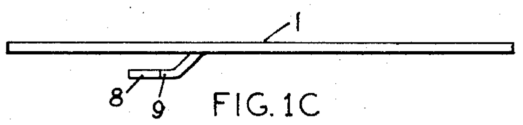
In FIG. 1C and 1D are shown side elevation views of sections of the emitter and detector lead frames, respectively, with jogged bonding pads.
Figure 1D:
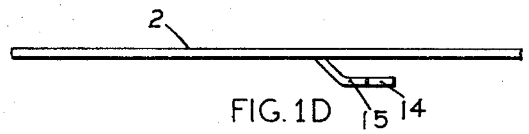

Referring to the drawings, in FIG. 1A is shown a top plan view of a section of an emitter lead frame 1 with flash bars 1*a* and flash stop 1*b* which supports the emitter leads 4, 5 and 6. FIG. 1B shows a top plan view of a section of a detector lead frame 2 with flash bars 2*a* and flash stop 2*b* which supports the detector leads 10, 11 and 12. Lead frames without flash bars 1*a* and 2*a* are entirely satisfactory. These lead frames can be any conductive material and in the present example are gold-plated Kovar. Initially, both lead frames are flat and of the identical configuration (prepared by photo-etching or stamping). The lead frames are then subjected to a pressing operation, e.g., with a pneumatic press, to jog or offset portions of the leads from the lead frames and define bonding pads or areas on the leads for attaching the LEDs and photo-sensitive devices and for bonding lead wires from these devices to the leads. The jogged leads are shown in FIGS. 1A and 1B with the line of jogging represented by the lines defining area 3 on leads 4, 5 and 6 in FIG. 1A, providing bonding pads 7, 8 and 9, and leads 10, 11 and 12 in FIG. 1B, providing bonding pads 13, 14 and 15. The jogged leads on emitter lead frame 1 and detector lead frame 2 are shown in side elevation view in FIGS. 1C and 1D, respectively.

Figure 2A:
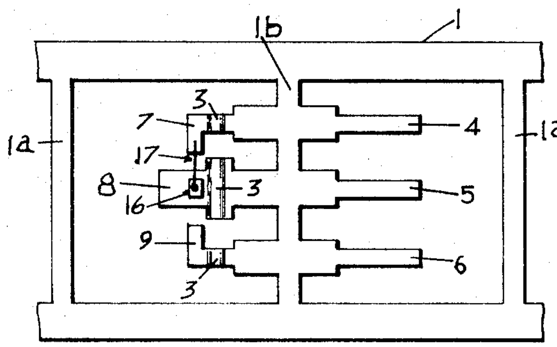
In FIG. 2A is shown a plan view of a section of the emitter lead frame with an LED attached to a bonding pad therefore and connected with a lead wire to an electrical input source.
Figure 2B:
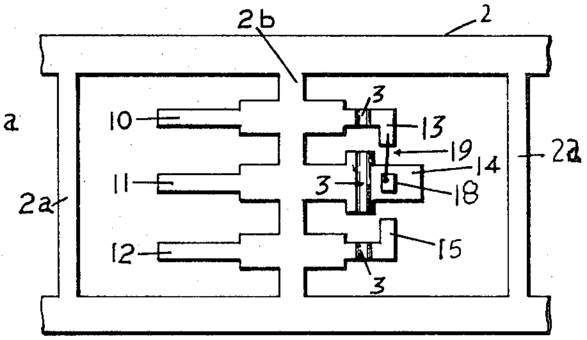
In FIG. 2B, 2C, and 2D are shown plan views of sections of typical photoresponsive devices attached and wire bonded to a detector lead frame.

After the lead jogging operation, the GaAs LED semiconductor chip (die) and silicon PIN photo-diode chip are attached (die-attach) to leads therefor on the emitter and detector lead frames, respectively. The GaAs LED chip 16 is bonded to bonding pad 8 of lead 5 as shown in FIG. 2A by means of a eutectic gold-silicon alloy preform. The silicon photodiode 18 is bonded to bonding pad 14 of lead 11 as shown in FIG. 2B. In place of a gold-silicon eutectic alloy, other bonding agents, e.g., a gold/germanium alloy, may be used.

The attached dice are then lead bonded with gold wire to appropriate leads on the lead frame by any suitable means, e.g., by thermo-compression bonding. As shown in FIG. 2A, connection is made from emitter chip 16 by a gold wire 17 to bonding pad 7 of lead 4; connection is made from the silicon photo-diode detector chip 18 by a gold wire 19 to bonding pad 13 of lead 10.

Figure 2C:
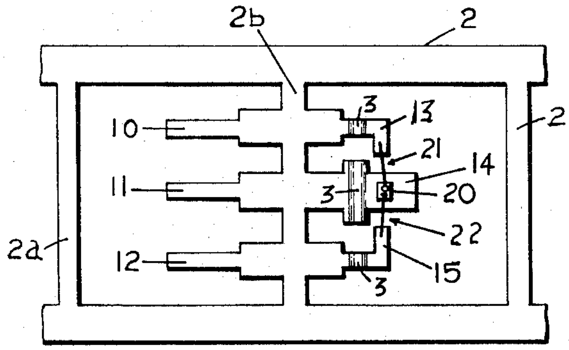
Figure 2D:
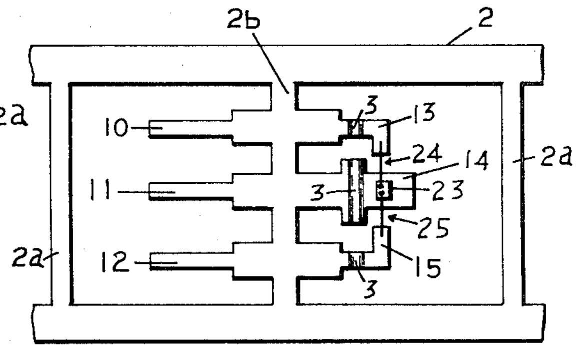

In other embodiments of the invention, two gold wire bonds are required on the detector leads. Thus, in FIG. 2C is shown the detector lead frame with another photo-sensitive device, e.g., an NPN silicon planar photo-transistor 20, attached to bonding pad 14 of collector lead 11, and lead bonded from the emitter portion of the transistor with gold wire 21 to the bonding pad 13 of emitter lead 10, and with gold wire 22 from the base region of the transistor to bonding pad 15 of the base lead 12. In still another embodiment, shown in FIG. 2D, the photo-sensitive device is a PNPN planar photo-SCR 23, attached to bonding pad 14 of the base lead 11 and lead bonded with gold wire 24 to bonding pad 13 of cathode lead 10, and with gold wire 25 to bonding pad 15 of gate lead 12. Other conductive materials may be used in place of the gold wire exemplified here.

After the emitter and detector dice are attached and lead bonded to their respective lead frames, the devices are then ready for a coupling operation to optically and mechanically couple them into an emitter-detector pair. The coupling is effected by placing a quantity of a semiconductor junction coating material, e.g., clear silicone resin, such as Dow Corning precoat material R-60-087, resin and catalyst, between the emitter and detector devices attached to their bonding pads in face-to-face relationship, with their leads pointing in opposite directions; this may be accomplished in a number of ways, one of which is described in the illustrative embodiment of this example.

Figures 3A, 3B:
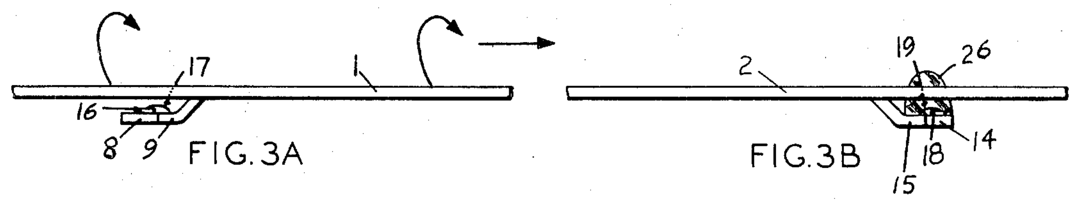
In FIGS. 3A, 3B, and 4 are shown views of successive steps in applying clear semiconductor junction coating material to the photo-detector device (FIG. 3B), inverting the emitter lead frame (FIG. 3A) and moving it into position relative to the detector lead frame (FIG. 3B) to couple the LED and photo-sensitive device with the coating material, as shown sectionally in FIG. 4.
Figure 4:
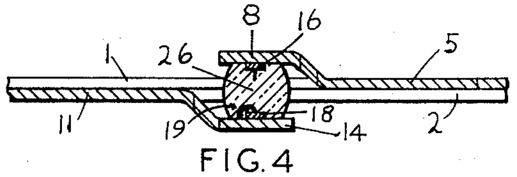
Figure 5:
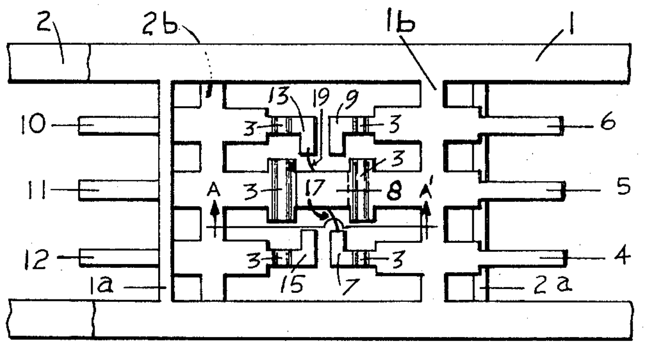
FIG. 5 is a plan view of a section of the coupled emitter and detector lead frames shown in section in FIG. 4.

Referring to FIGS. 2A and 2B, the emitter and detector lead frames are shown in plan view in the initial position with their leads pointing in opposite directions; a side elevation view of this positional relationship is shown in FIGS. 3A and 3B. In FIG. 3B, a quantity of clear silicone resin 26 is seen spotted on the silicon photo-diode 18 attached to bonding pad 14 of lead frame 2. In FIG. 3A is shown the inversion of the emitter lead frame 1 and moving of it to a position above the detector lead frame prior to bringing the lead frames into contact. In FIG. 5 is shown a top plan view of the emitter lead frame 1 after it has been positioned and brought into contact with the detector lead frame 2, thus encapsulating and coupling the LED and silicon photo-diode in the clear silicone resin spotted on the detector shown in FIG. 3B. The coupled lead frames are then placed in an oven and heated to about 150°C for 2 hours to cure the resin. In FIG. 4 is shown a sectional view of the emitter-detector coupled pair after encapsulation in clear resin; the view is taken from a section defined by line A–A′ in FIG. 5. In FIG. 4, the wire bonded GaAs LED 16 is seen attached to bonding pad 8 of lead 5 on emitter lead frame 1 and coupled, optically and mechanically, by the cured clear silicone resin 26 to the wire-bonded silicon photo-detector 18 attached to bonding pad 14 of lead 11 on detector lead frame 2.

Figure 6A:
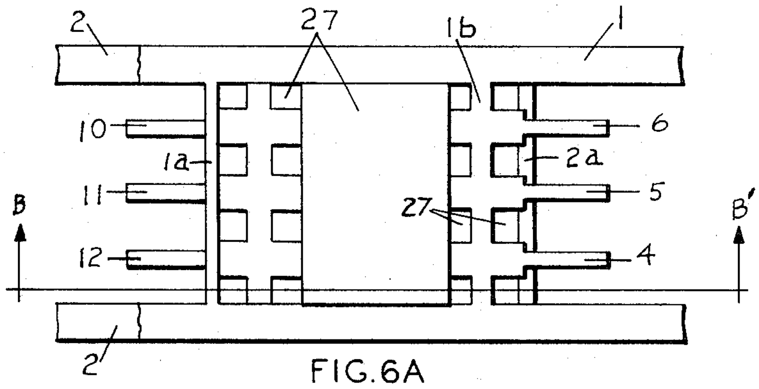
In FIGS. 6A and 6B are shown a plan view and a section view, respectively, of a section of the lead frame having the coupled-pair devices encapsulated in opaque plastic material.
Figure 6B:
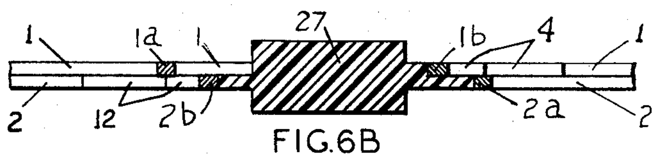

The next step in the opto-isolator fabrication process involves the encapsulation of the emitter-detector pair with an opaque plastic material. This may be done by any suitable method including potting, injection molding or transfer molding; the latter method is preferred and used in this embodiment. The coupled lead frame structure with the emitter-detector pair encapsulated in clear silicone resin as shown in FIGS. 4 and 5 is placed in a transfer mold charged with a black plastic molding material 27, e.g., a silicone resin such as Dow Corning 306, and subjected to a molding operation with a mold temperature of about 190°C at a curing cycle time of about 2.0 to 2.5 minutes under a transfer pressure of about 600 psig and clamp pressure of about 15 tons. When the cycle is complete the black-plastic encapsulated coupled pair lead frame structure is ejected from the molding apparatus and appears as shown in top plan view of FIG. 6A and in sectional view in FIG. 6B (section view is along line B–B′ in FIG. 6A).

Figure 8:
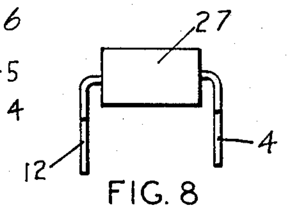
FIG. 8 is a front elevation view of the emitter-detector coupled pair (opto-isolators) after the lead-outs have been formed into a six-lead dual-in-line configuration.

The use of opaque plastic material 27 provides the external housing of emitter-detector coupled pair in a configuration, schematically shown in FIG. 8, suitable for handling with automatic insertion equipment. In addition to providing the plastic outline configuration of the opto-isolator product, the molded opaque plastic encapsulation provides an optical barrier between the emitter-detector coupled pair and the outside world and, further, adds additional strength to the shock and vibration resistance already provided by the clear encapsulant of the coupled pair.

Figure 7:
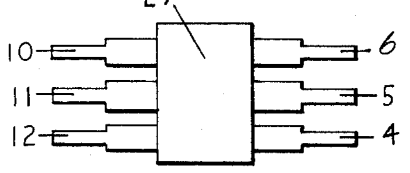
FIG. 7 shows a plan view after shearing the individual coupled pairs from the lead frames.

After the transfer molding operation, the black plastic encapsulated coupled-pair is subjected to a post curing treatment by heating in an oven at 200°C for about 2 hours. Thereafter, the transfer molded coupled lead frame structure is subjected to a shearing operation which removes the plastic-packaged emitter-detector coupled pair from the lead frames by shearing the flash stops connecting the emitter and detector leads. The individual units then appear as shown in FIG. 7, with all of the GaAs LED input leads, anode 4, cathode 5 and open (not connected) lead 6, appearing on the right side (as viewed) of the device, and all of the silicon PIN photo-diode detector output leads, anode 10, cathode 11 and open lead 12, appearing on the left side of the device. Although two of the leads in the device of this embodiment are open, the six-lead structure provides symmetry, compatibility with automatic insertion into standard dual-in-line printed circuit boards and available bonding pads and leads for other detector devices and/or alternative circuits.

Following the shearing operation, the leads are bent by a lead-forming operation into the dual-in-line configuration as shown from one end in FIG. 8.

As apparent from the foregoing description, the opto-isolator devices of this invention are unique in the utilization of two lead frames, one for the LED device and one for the detector device; one lead frame providing input leads for the emitter device and the other providing output leads for the detector device, with the leads on each lead frame having a jogged, indented or bent portion serving as bonding pads for die attach and wire bonding; when the lead frames are coupled, the lead-outs and jogged bonding pads of the emitter leads face in opposite directions to those of the lead-outs and jogged bonding pads of the detector leads. The fabricated device is further unique in providing six-lead plastic-packaged opto-isolators having a dual-in-line configuration.

As will be apparent to those skilled in the art, other equivalent materials, process steps, package geometries, etc., are suitably used herein. For example, any conductive metal, e.g., aluminum, or equivalent material may be used for the lead frames and wire leads. Other equivalent materials, e.g., gold/epoxy, may be used for bonding the emitter and detector chips to their bonding pads. Clear epoxy or other equivalent materials having, e.g., a dielectric strength greater than about 500 V/mil, an index of refraction greater than 1.4 and a softening point greater than about 125°C, may be substituted for clear silicone as the initial encapsulant for the emitter-detector pair. Other opaque materials than black silicone which are pottable or moldable by injection or transfer molding and having similar properties suitable for encapsulation of electronic devices may be used as the final encapsulant package for the emitter-detector pair. Alternative lead configurations contemplated herein include input and output leads on both sides of the device and configurations wherein the lead-outs emerge from the ends or top and bottom of the package, depending upon the initial lead frames coupling arrangement, and are formable into the dual-in-line configuration. The LED may be any solid-state material which emits light, visible or IR, under forward bias, and the detector may be any material responsive to the wavelength of light emitted by the LED and transmitted through the encapsulant for the emitter-detector pair.

The opto-isolator, exemplified in the above example, using a diffused planar GaAs LED and a diffused planar silicon PIN photo-diode detector coupled pair, provides ultra-fast switching time (5 nanoseconds), very high isolation resistance (10″ ohms), 1,500 volt isolation between emitter and detector and low coupling capacitance (1.3 pF). These opto-isolators are suitable for use in applications where a high input-to-output isolation is required to provide unilateral signal transfer with ultra-fast speed of response. Such applications include high speed isolated amplifiers, pulse transformers, relays, opto-electronic feedback circuits, isolated logic switches. These opto-isolators are excellent performers in linear or digital circuits.

The opto-isolator using an NPN silicon phototransistor (referred to above in connection with FIG. 2C) exhibits a high current transfer ratio (35 percent), the same isolation resistance, voltage isolation and coupling capacitance of the above-described photodiode coupled pair. Applications for the phototransistor coupled pairs are as isolation transformers, pulse transformers or relays for systems isolation, chassis isolation, general purpose switching, phase control and high voltage power supply control.

Opto-isolators herein using a PNPN photo-SCR also have the isolation resistance, voltage isolation and coupling capacitance referred to above, a built-in memory and AC switch (SPST). These devices are useful in applications where complete electrical isolation is required between low power circuitry such as integrated circuits and AC line voltages providing high speed switching or relay functions. Their bi-stable characteristics make these opto-isolators suitable for use as a latching relay in D.C. circuits.

The foregoing detailed description of the invention may suggest other modifications and variations to those skilled in the art without departing from the spirit and scope of this invention.

I claim:

1. Opto-isolator devices comprising:

a. a semiconductor light-emitting diode attached to a jogged bonding pad of an electrical input lead;

b. a semiconductor photo-responsive device attached to a jogged bonding pad of an electrical output lead in face-to-relationship with said light-emitting diode;

c. conductive means connecting said light-emitting diode with a lead to an electrical input source;

d. conductive means connecting said photo-responsive device to at least one lead to an electrical output circuit;

e. means for optically and mechanically coupling said light-emitting diode and said photo-responsive device;

f. opaque encapsulation means for the optically and mechanically coupled light-emitting diode and photo-responsive device, conductive means of elements (c) and (d), and a portion of said input and output leads which are formed into a dual-in-line configuration outside said encapsulation means.

2. Opto-isolator devices according to claim 1 wherein said conductive means for said light-emitting diode and said photo-responsive device is gold wire; said means for optically and mechanically coupling said light-emitting diode and said photo-responsive device is a clear silicone material, and said opaque encapsulation means is a black silicone material.

3. Opto-isolator devices according to claim 2 wherein said light-emitting diode is gallium arsenide.

4. Opto-isolator devices according to claim 3 wherein said photo-responsive device is a silicon photodiode.

5. Opto-isolator devices according to claim 3 wherein said photo-responsive device is a silicon phototransistor.

6. Opto-isolator devices according to claim 3 wherein said photo-responsive device is a photo-SCR.

7. Opto-isolator devices according to claim 3 wherein said photo-responsive device is a photo-FET.

8. Opto-isolator devices according to claim 3 wherein said photo-responsive device is a photo-sensitive integrated circuit.

9. Lead frame-mounted opto-isolator packages for radiation emitters which are optically coupled to radiation detectors including, in combination:

a. a first conductive lead frame comprising a plurality of conductive lead members and bonding pads which are off-set with respect to said lead members, b. radiation-emissive semiconductor devices bonded to said pads therefor and adapted to be energized with an electrical current and responsive thereto to generate radiation of a predetermined wavelength, c. a second lead frame comprising a plurality of conductive lead members and also having bonding pads which are off-set with respect to its lead members, d. radiation detector semiconductor devices bonded to said pads therefor of said second lead frame and adapted to be energized and responsive to radiation emitted from said radiation-emissive semiconductor devices, e. conductive means connecting said radiation-emissive and radiation detector devices, respectively, with lead members on said first and second lead frames, and f. coupling means for said first and second lead frames rigidly positioning them and their bonding pads in a predetermined and fixed spaced apart relationship whereby the off-set bonding pads permit said radiation emitters and detectors, respectively, to be spaced apart in face-to-face relationship, and optically coupled.

10. The packages defined in claim 9 wherein said means for maintaining said lead frames in a spaced-apart relationship includes a light-transmitting silicone resin encapsulating said emitters and detectors and provides an optical path therebetween.

11. The packages defined in claim 9 wherein said first and second lead frames and coupling means are encapsulated in opaque plastic so that the conductive lead members extend from said plastic encapsulation and may be oriented for connection to desired electrical apparatus.

* * * * *